United States Patent
Huang

(10) Patent No.: US 11,424,270 B2
(45) Date of Patent: Aug. 23, 2022

(54) FLEXIBLE DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Jing Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 265 days.

(21) Appl. No.: 16/962,236

(22) PCT Filed: Jun. 17, 2020

(86) PCT No.: PCT/CN2020/096581
§ 371 (c)(1),
(2) Date: Jul. 15, 2020

(87) PCT Pub. No.: WO2021/243752
PCT Pub. Date: Dec. 9, 2021

(65) Prior Publication Data
US 2021/0375947 A1    Dec. 2, 2021

(30) Foreign Application Priority Data
Jun. 2, 2020 (CN) .......................... 202010488195.4

(51) Int. Cl.
*H01L 27/15* (2006.01)
*H01L 27/12* (2006.01)
(Continued)

(52) U.S. Cl.
CPC ...... *H01L 27/1214* (2013.01); *H01L 51/0097* (2013.01); *H01L 51/5253* (2013.01); *H01L 51/56* (2013.01)

(58) Field of Classification Search
CPC ................................................ H01L 27/1214
See application file for complete search history.

(56) References Cited

U.S. PATENT DOCUMENTS 8,018,141 B2 *   9/2011   Kim ................... H01L 51/5206
                                                        313/506
8,822,998 B2 *   9/2014   Kim ..................... H01L 27/326
                                                        313/506
(Continued)

FOREIGN PATENT DOCUMENTS

CN      106981584 A      7/2017
CN      109461832 A      3/2019
(Continued)

*Primary Examiner* — Caleb E Henry
(74) *Attorney, Agent, or Firm* — Mark M. Friedman

(57) ABSTRACT

A flexible display device and a method of manufacturing thereof are provided. The flexible display device includes a flexible substrate, a thin film transistor disposed on the flexible substrate, a luminescent layer disposed on the thin film transistor, a first retaining wall and a second retaining wall disposed on the thin film transistor, and an encapsulation layer. The encapsulation layer includes a first inorganic layer, an organic layer, and a second inorganic layer. The first inorganic layer covers the first retaining wall, the second retaining wall, and one part of the thin film transistor. A plurality of first grooves are disposed in the first inorganic layer. The organic layer fills the plurality of first grooves and covers the luminescent layer and the other part of the thin film transistor. The second inorganic layer covers the first inorganic layer and the organic layer.

20 Claims, 4 Drawing Sheets

(51) Int. Cl.
*H01L 51/56* (2006.01)
*H01L 51/00* (2006.01)
*H01L 51/52* (2006.01)

(56) References Cited

U.S. PATENT DOCUMENTS

| | | | | |
|---|---|---|---|---|
| 9,324,947 | B2* | 4/2016 | Sato | H01L 51/0015 |
| 9,614,015 | B2* | 4/2017 | Park | H01L 51/5268 |
| 9,716,208 | B2* | 7/2017 | Dozen | H01L 27/3246 |
| 10,916,723 | B2* | 2/2021 | Lee | H01L 51/56 |
| 2004/0228964 | A1* | 11/2004 | Ito | H01L 51/0005 |
| | | | | 427/256 |
| 2006/0097263 | A1* | 5/2006 | Lee | H01L 27/3246 |
| | | | | 257/72 |
| 2007/0159089 | A1* | 7/2007 | Oh | H01L 51/5246 |
| | | | | 313/506 |
| 2009/0128020 | A1* | 5/2009 | Takei | H01L 27/3223 |
| | | | | 313/504 |
| 2010/0181559 | A1* | 7/2010 | Nakatani | H01L 27/3283 |
| | | | | 438/34 |
| 2011/0233572 | A1* | 9/2011 | Nakatani | H01L 27/3246 |
| | | | | 257/88 |
| 2011/0260955 | A1* | 10/2011 | Yoshida | H01L 27/3283 |
| | | | | 345/76 |
| 2013/0099221 | A1* | 4/2013 | Kawamura | H01L 51/52 |
| | | | | 438/34 |
| 2013/0234126 | A1* | 9/2013 | Nakatani | H01L 27/3283 |
| | | | | 438/34 |
| 2014/0159074 | A1* | 6/2014 | Isobe | H01L 27/3288 |
| | | | | 438/34 |
| 2015/0048319 | A1 | 2/2015 | Moon | |
| 2015/0171327 | A1* | 6/2015 | Matsushima | H01L 27/3218 |
| | | | | 438/35 |
| 2016/0093680 | A1* | 3/2016 | Paek | H01L 51/5228 |
| | | | | 438/34 |
| 2018/0254303 | A1* | 9/2018 | Mishima | H01L 51/5206 |
| 2020/0006661 | A1* | 1/2020 | Shinokawa | B23K 26/123 |
| 2020/0194513 | A1* | 6/2020 | Kim | H01L 27/3246 |
| 2020/0227661 | A1* | 7/2020 | Nishikiori | H01L 51/0021 |
| 2020/0280021 | A1 | 9/2020 | Li et al. | |
| 2021/0183972 | A1* | 6/2021 | Son | H01L 51/56 |

FOREIGN PATENT DOCUMENTS

| | | |
|---|---|---|
| CN | 109616506 A | 4/2019 |
| CN | 110211995 A | 9/2019 |
| CN | 110335961 A | 10/2019 |
| CN | 110444571 A | 11/2019 |
| CN | 110556405 A | 12/2019 |
| CN | 110690262 A | 1/2020 |
| CN | 110854297 A | 2/2020 |

* cited by examiner

FLEXIBLE DISPLAY DEVICE AND MANUFACTURING METHOD THEREOF

CROSS REFERENCE TO RELATED APPLICATIONS

The present application claims priority to Chinese Patent Application No. 202010488195.4 filed on Jun. 2, 2020 submitted to National Intellectual Property Administration, PRC, with the invention titled "flexible display device and manufacturing method thereof", the entire contents of which are hereby incorporated by reference in this application.

FIELD OF INVENTION

The present disclosure relates to a display device and a manufacturing method thereof, and more particularly, to a flexible display device and a manufacturing method thereof.

DESCRIPTION OF PRIOR ART

Organic light-emitting diodes (OLED) have the advantages of fast response times, wide temperature ranges, self-luminescence, and flexible display. Therefore, OLEDs are known as the third generation display technology after cathode ray tubes (CRT) and liquid crystal displays/light-emitting diodes (LCD/LED). At present, with the increase in market demand, the research and development and production of flexible OLEDs have become a hot area of development in the present display industry. Thin film packaging technology is the key technology to ensure the reliability of flexible OLED panels.

Generally, the flexible encapsulation structure is composed of laminated films of an inorganic layer/organic layer/inorganic layer, and the inorganic layer is used to block the invasion of water and oxygen. The organic layer is used to coat particles to relieve stress and flatten. In addition, the stress of the inorganic layer in the patterned area is significantly concentrated. Therefore, when the panel is subjected to dynamic bending or reliability testing, these stress-concentrated areas are prone to crack or peel, thereby seriously affecting the reliability of the panel.

U.S. Pat. No. 9,287,335 discloses a method for improving cracks in the inorganic film layer caused by cutting. As shown in FIG. 1, a cell panel 1 comprises a thin film transistor (TFT) layer 10, a light-emitting unit 20, and an encapsulation layer 30. An organic layer 12 is disposed between the cell panels 1, and the organic layer 12 and a flat layer 11 in the thin film transistor layer 10 are manufactured by the same process, but the organic layer 12 and the flat layer 11 do not contact each other, so as to avoid water and oxygen laterally invading the thin film transistor layer 10 after being cut with a cutting knife 40. The organic material of the organic layer 12 is mainly an organic polymer such as polyimide (PI) or acryl. The method described above may make the cutter wheel or laser "softly land" on the cutting path of the substrate, thereby effectively reducing the damage to the substrate caused by cutting.

In addition, U.S. Pat. No. 9,472,779 discloses a method for preparing a crack suppression layer. As shown in FIG. 2, the crack suppression layer 60 is mainly composed of an organic material. The object of the crack suppression layer 60 is used to prevent mechanical stress generated during cutting with a cutting blade 70, which causes the edge of the inorganic layer 50 to crack, thereby affecting the surface roughness (RA) of the panel. This is a method commonly used to prevent edge cracks in OLED panels.

Therefore, how to reduce the cracks or peeling of the inorganic layer at the boundary of the panel is one of the problems that the flexible display device needs to be improved at present.

Technical Problem

The object of the present invention is to provide a flexible display device which can disperse the stress of the inorganic layer during the bending or surface roughness test of the panel, thereby reducing the risk of cracking or peeling of the packaging layer.

SUMMARY OF INVENTION

Technical Solution

In order to achieve the object of the present disclosure described above, the present disclosure provides a flexible display device comprising a flexible substrate, a thin film transistor, a luminescent layer, a first retaining wall, a second retaining, and an encapsulation layer. The thin film transistor is disposed on the flexible substrate. The luminescent layer is disposed on the thin film transistor. The first retaining wall and the second retaining wall are disposed on the thin film transistor, and the first retaining wall is located between the luminescent layer and the second retaining wall. The encapsulation layer comprises a first inorganic layer, an organic layer, and a second inorganic layer. The first inorganic layer covers the first retaining wall, the second retaining wall, and one part of the thin film transistor. A plurality of first grooves are disposed in the first inorganic layer close to at least one side of the second retaining wall, and the organic layer fills the plurality of first grooves and covers the luminescent layer and the other part of the thin film transistor. The second inorganic layer covers the first inorganic layer and the organic layer. The plurality of first grooves are disposed in the first inorganic layer close to both sides of the second retaining wall, and the plurality of first grooves are a plurality of discontinuous grooves.

According to one the embodiment of the present disclosure, the flexible display device further comprises a crack suppression structure disposed on the flexible substrate. The first inorganic layer covers the crack suppression structure. A plurality of second grooves are disposed in the first inorganic layer close to at least one side of the crack suppression structure, and the organic layer fills the plurality of second grooves.

According to one the embodiment of the present disclosure, the plurality of second grooves are disposed in the first inorganic layer close to both sides of the crack suppression structure.

According to one the embodiment of the present disclosure, a first depth of each of the plurality of first grooves is less than or equal to a half thickness of the first inorganic layer, and a second depth of each of the plurality of second grooves is less than or equal to a half thickness of the first inorganic layer.

According to one the embodiment of the present disclosure, a material of the organic layer comprises acrylate, polyacrylate, polycarbonate or polystyrene.

According to one the embodiment of the present disclosure, a pattern shape of each of the plurality of first grooves comprises a circle, a quadrangle, or a trapezoid.

The present disclosure further provides a flexible display device, comprising a flexible substrate, a thin film transistor, a luminescent layer, a first retaining wall, a second retaining wall, and an encapsulation layer. The thin film transistor is disposed on the flexible substrate. The luminescent layer is disposed on the thin film transistor. The first retaining wall and the second retaining wall are disposed on the thin film transistor, and the first retaining wall is located between the luminescent layer and the second retaining wall. The encapsulation layer comprises a first inorganic layer, an organic layer, and a second inorganic layer. The first inorganic layer covers the first retaining wall, the second retaining wall, and one part of the thin film transistor. A plurality of first grooves are disposed in the first inorganic layer close to at least one side of the second retaining wall. The organic layer fills the plurality of first grooves and covers the luminescent layer and the other part of the thin film transistor, and the second inorganic layer covers the first inorganic layer and the organic layer.

According to one the embodiment of the present disclosure, the plurality of first grooves are disposed in the first inorganic layer close to both sides of the second retaining wall.

According to one the embodiment of the present disclosure, the flexible display device further comprises a crack suppression structure disposed on the flexible substrate. The first inorganic layer covers the crack suppression structure. A plurality of second grooves are disposed in the first inorganic layer close to at least one side of the crack suppression structure, and the organic layer fills the plurality of second grooves.

According to one the embodiment of the present disclosure, the plurality of second grooves are disposed in the first inorganic layer close to both sides of the crack suppression structure.

According to one the embodiment of the present disclosure, a first depth of each of the plurality of first grooves is less than or equal to a half thickness of the first inorganic layer, and a second depth of each of the plurality of second grooves is less than or equal to a half thickness of the first inorganic layer.

According to one the embodiment of the present disclosure, a material of the organic layer comprises acrylate, polyacrylate, polycarbonate or polystyrene.

According to one the embodiment of the present disclosure, a pattern shape of each of the plurality of first grooves comprises a circle, a quadrangle, or a trapezoid.

The present disclosure further provides a method of manufacturing a flexible display device, comprising steps of: providing a flexible substrate; disposing a thin film transistor on the flexible substrate; disposing a luminescent layer on the thin film transistor; disposing a first retaining wall and a second retaining wall on the thin film transistor, wherein the first retaining wall is located between the luminescent layer and the second retaining wall; and disposing an encapsulation layer. The encapsulation comprises a first inorganic layer, an organic layer, and a second inorganic layer. The first inorganic layer covers the first retaining wall, the second retaining wall, and one part of the thin film transistor, and a plurality of first grooves are disposed in the first inorganic layer close to at least one side of the second retaining wall. The organic layer fills the plurality of first grooves and covers the luminescent layer and the other part of the thin film transistor. The second inorganic layer covers the first inorganic layer and the organic layer.

According to one the embodiment of the present disclosure, the method of manufacturing the flexible display device further comprising: disposing a crack suppression structure on the flexible substrate. The first inorganic layer covers the crack suppression structure. A plurality of second grooves are disposed in the first inorganic layer close to at least one side of the crack suppression structure, and the organic layer fills the plurality of second grooves.

According to one the embodiment of the present disclosure, a method of disposing the plurality of first grooves and the plurality of second grooves comprises photolithography or dry etching.

According to one the embodiment of the present disclosure, a method of filling the plurality of first grooves and the plurality of second grooves with the organic layer comprises an inkjet printing method.

According to one the embodiment of the present disclosure, a first depth of each of the plurality of first grooves is less than or equal to a half thickness of the first inorganic layer, and a second depth of each of the plurality of second grooves is less than or equal to a half thickness of the first inorganic layer.

According to one the embodiment of the present disclosure, a material of the organic layer comprises acrylate, polyacrylate, polycarbonate or polystyrene.

According to one the embodiment of the present disclosure, a pattern shape of each of the plurality of first grooves comprises a circle, a quadrangle, or a trapezoid.

Beneficial Effect

The beneficial effects of the present disclosure are: the stress of the inorganic layer of the flexible display device of the present disclosure may be dispersed during the process of bending or testing the surface roughness of the panel by filling the stress concentration area with the organic materials, thereby reducing the risk of cracking or peeling of the encapsulation layer and ensuring the surface roughness performance of the panel, which may facilitate the development of narrow bezel flexible displays.

BRIEF DESCRIPTION OF DRAWINGS

In order to make the above contents of the present disclosure more clearly and understandable, the preferred embodiments are described in detail below, accompanying with the attached drawings, and detailed descriptions are as follows.

DETAILED DESCRIPTION OF PREFERRED EMBODIMENTS

Figure 1:
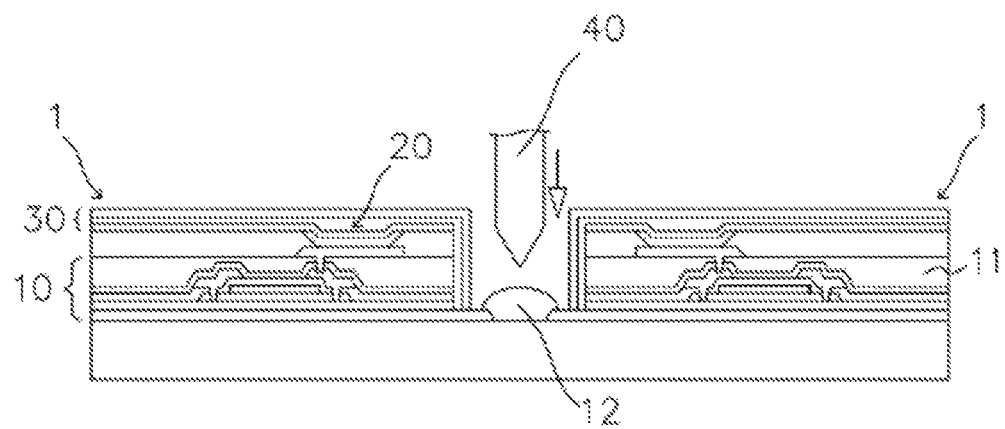
FIG. 1 is a cross-sectional view of the flexible display device according to the conventional technology.
Figure 2:
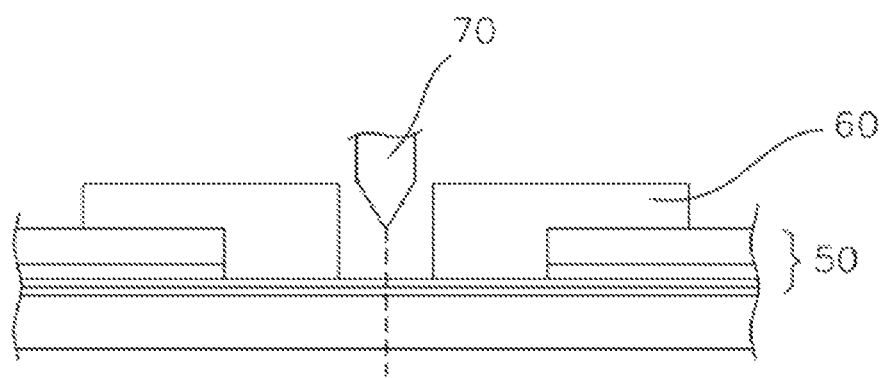
FIG. 2 is another cross-sectional view of the flexible display device according to the conventional technology.

The descriptions of the following embodiments refer to the attached drawings and illustrate specific embodiments that can be implemented by the present disclosure. Moreover, the direction terms used in the present disclosure, such as upper, lower, top, bottom, front, back, left, right, inside, outside, side, boundary, central, horizontal, vertical, longitudinal, axial, radial, uppermost layer or lowermost layer, etc. are based on the orientational or positional relationship shown in the drawings. Therefore, the used direction terms are merely for explanation and convenience of description of the present disclosure, rather than limiting the scope of the present disclosure.

Figure 3:
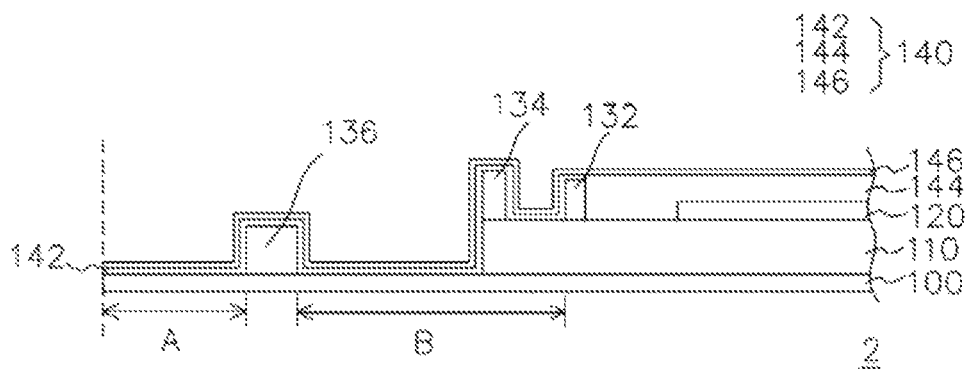
FIG. 3 is a cross-sectional view of the flexible display device according to one embodiment of the present disclosure.

FIG. 3 is a cross-sectional view of the flexible display device according to one embodiment of the present disclosure. FIGS. 4A to 4D are cross-sectional views of the method of manufacturing the flexible display device according to one embodiment of the present disclosure. FIG. 5A is a top view of the plurality of grooves of the flexible display device according to one embodiment of the present disclosure. FIG. 5B is a top view of the plurality of grooves of the flexible display device according to another embodiment of the present disclosure.

First, referring to FIG. 3, the flexible display device 2 of the present disclosure comprises a flexible substrate 100, a thin film transistor 110, a luminecent layer 120, a first retaining wall 132, a second retaining wall 134, and an encapsulation layer 140.

In the present embodiment, the thin film transistor 110 is disposed on the flexible substrate 100. The luminescent layer 120 is disposed on the thin film transistor 110. In some embodiments, the thin film transistor 110 may comprise, for example, a semiconductor layer, a gate electrode, a source electrode, and/or a drain electrode (not shown). For example, the luminescent layer 120 is disposed on a pixel electrode (not shown), where the pixel electrode may be connected to the drain electrode of the thin film transistor 110. FIG. 3 only shows the components related to the present disclosure, and other components not shown may be configured according to the components of conventional semiconductors.

In the present embodiment, the first retaining wall 132 and the second retaining wall 134 are disposed on the thin film transistor 110, and the first retaining wall 132 is located between the luminescent layer 120 and the second retaining wall 134. In some embodiments, for example, the materials of the first retaining wall 132 and the second retaining wall 134 are organic photoresist materials, which may be used to prevent ink overflow. In some embodiments, the height of the first retaining wall 132 and the height of the second retaining wall 134 may be the same or different. In the present embodiment, for example, the height of the second retaining wall 134 is greater than the height of the first retaining wall 132, and the height difference between the second retaining wall 134 and the first retaining wall 132 is, for example, between 1 and 1.5 microns, but the present disclosure is not limited thereto.

In the present embodiment, the encapsulation layer 140 comprises a first inorganic layer 142, an organic layer 144, and a second inorganic layer 146. The first inorganic layer 142 covers the first retaining 132, the second barrier 134, and the exposed part of the thin film transistor 110 (between the first retaining wall 132 and the second retaining wall 134). The first inorganic layer 142 close to at least one side of the second retaining wall 134 has the plurality of first grooves (not shown, referring to the details below). The organic layer 144 fills the plurality of first grooves and covers the luminescent layer 120 and the other exposed part of the thin-film transistor 110 (between the first retaining 132 and the luminescent layer 120). The second inorganic layer 146 covers the first inorganic layer 142 and the organic layer 144.

It should be noted that in the present embodiment, the boundary of the organic layer 144 is at the first retaining wall 132. Therefore, in the area between the first retaining wall 132 and the cutting path 160, the stress of the inorganic layer at the pattern may be obvious concentrated, such as, both sides (area A and area B) of the second retaining wall 134 or the crack suppression structure 136 (described later). That is to say, during the processes of bending or testing the surface roughness of the panel, cracks or peeling of the encapsulation layer are likely to occur on both sides of the second retaining wall 134 or the crack suppression structure 136.

In the present embodiment, the process of filling the stress concentration area of the first inorganic layer 142 of the flexible display device with an organic material is described as follows. In detail, first, please refer to FIG. 4A to dispose a second retaining wall 134 on the flexible substrate 100 (a part of the thin film transistor 110 is omitted in FIG. 4A). Then, a first inorganic material layer 141 is disposed to cover the second retaining wall 134 and the flexible substrate 100. In some embodiments, a material of the first inorganic material layer 141 comprises, for example, silicon nitride ($SiN_x$), silicon oxide ($SiO_x$), silicon oxynitride (SiON), or aluminum oxide ($Al_2O_3$). The present disclosure does not particularly limit the material of the first inorganic material layer 141, as long as the inorganic material may be used to increase the performance of water and oxygen resistance of the device.

Figure 4A:
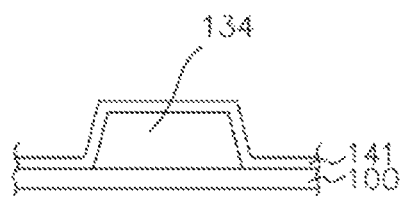
FIGS. 4A to 4D are cross-sectional views of the method of manufacturing the flexible display device according to one embodiment of the present disclosure.
Figure 4B:
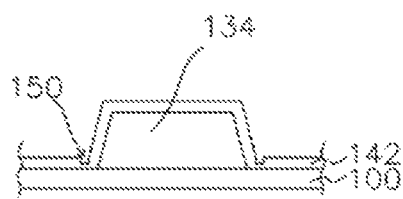
Figure 5A:
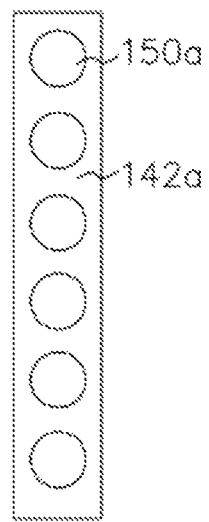
FIG. 5A is a top view of the plurality of grooves of the flexible display device according to one embodiment of the present disclosure.
Figure 5B:
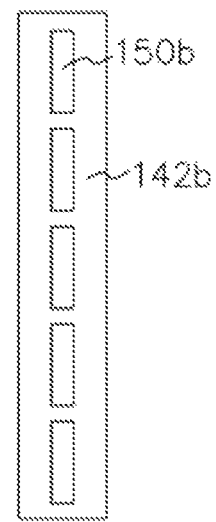
FIG. 5B is a top view of the plurality of grooves of the flexible display device according to another embodiment of the present disclosure.

Next, referring to FIG. 4B, a part of the first inorganic material layer 141 is removed, so that a plurality of first grooves 150 are formed in the first inorganic layer 142 close to at least one side of the second retaining wall 134. In the present embodiment, a plurality of first grooves 150 (as shown in FIG. 4B) are disposed in the first inorganic layer 142 close to both sides of the second retaining wall 134, but the present disclosure is not limited thereto. That is to say, in other embodiments, a plurality of first grooves 150 may also be disposed only in the first inorganic layer 142 close to one side of the second retaining wall 134. In some embodiments, a patterning method of disposing the plurality of first grooves 150 comprises, for example, photolithography or dry etching, but the present disclosure is not limited thereto. In some embodiments, the plurality of first grooves 150 are discontinuous groove patterns, and a shape of each of the discontinuous groove patterns comprises, for example, a circle, a quadrangle, or a trapezoid. The present disclosure does not particularly limit the shapes of the plurality of first grooves 150. For example, referring to FIG. 5A, the groove pattern shape of each of the plurality of first grooves 150a disposed in the first inorganic layer 142a is, for example, a circle. Referring to FIG. 5B, the groove pattern shape of each of the plurality of first grooves 150b disposed in the first inorganic layer 142b is, for example, a quadrangle. In addition, the size of each of the plurality of first grooves 150 may be adjusted adaptively according to the design of the panel boundary. In some embodiments, the depth of each of the plurality of first grooves 150 is, for example, less than or equal to the half thickness of the first inorganic layer 142.

Figure 4C:
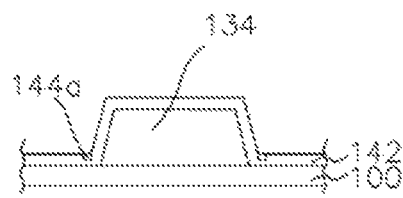

Then, referring to FIG. 4C, an organic layer 144a is disposed to fill the plurality of first grooves 150. In some embodiments, the material of the organic layer 144a comprises, for example, acrylate, polyacrylate, polycarbonate, or polystyrene, but the present disclosure is not limited thereto. In the present embodiment, the material of the organic layer 144a filling the plurality of first grooves 150 may be used to disperse the stress of the inorganic layer during the process of bending or testing the surface roughness of the panel. In the present embodiment, the organic layer 144a is manufactured in the same process as the organic layer 144 of the encapsulation layer 140. In this case, the material of the organic layer 144a is the same as the material of the organic layer 144. However, in other embodiments, the organic layer 144a may be manufactured in a different process from the organic layer 144 of the encapsulation layer 140. In this case, the material of the organic layer 144a may be the same as or different from the material of the organic layer 144. In some embodiments, the method of filling the plurality of first grooves 150 with the organic layer 144a comprises, for example, an inkjet printing method, but the present disclosure is not limited thereto.

Figure 4D:
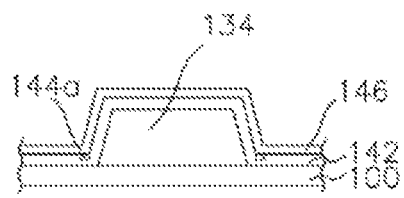

Finally, referring to FIG. 4D, a second inorganic layer 146 is disposed to cover the first inorganic layer 142 and the organic layer 144a. In some embodiments, the material of the second inorganic layer 146 comprises, for example, silicon nitride (SiNx), silicon oxide ($SiO_x$), silicon oxynitride (SiON), or aluminum oxide ($Al_2O_3$). The present disclosure does not particularly limit the material of the second inorganic layer 146, as long as the inorganic material may be used to increase the performance of water and oxygen resistance of the device.

So far, the process of filling the stress concentration area of the first inorganic layer 142 of the flexible display device of the present disclosure with the organic material is completed, to disperse the stress of the inorganic layer during the process of bending or testing the surface roughness test of the panel, thereby reducing the risk of cracking or peeling of the encapsulation layer and ensuring the surface roughness performance of the panel, which may facilitate the development of narrow bezel flexible displays. In addition, the flexible display device of the present disclosure may be generally applied to the field of OLED device capable of bending, folding and rolling.

Figure 6:
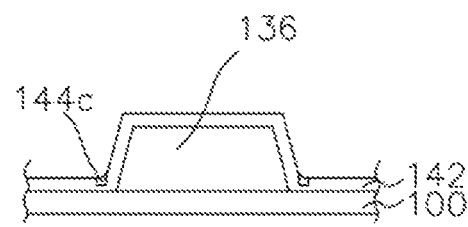
FIG. 6 is a cross-sectional view of the flexible display device according to another embodiment of the present disclosure.

FIG. 6 is a cross-sectional view of the flexible display device according to another embodiment of the present disclosure.

Please refer to FIG. 6. In the present embodiment, the method of manufacturing the flexible display device is similar to the method of manufacturing the flexible display device of FIGS. 4A to 4D. The difference is that a plurality of grooves of the flexible display device of FIG. 6 are disposed in the first inorganic layer 142 close to at least one side of the crack suppression structure 136. In detail, first, the crack suppression structure 136 is disposed on the flexible substrate 100. Next, a first inorganic material layer (not shown) is disposed to cover the crack suppression structure 136 and the flexible substrate 100. A part of the first inorganic material layer is removed to form a plurality of second grooves (not shown) in the first inorganic layer 142 close to at least one side of the crack suppression structure 136. In the present embodiment, a plurality of second grooves are disposed in the first inorganic layer 142 close to both sides of the crack suppression structure 136, but the present disclosure is not limited thereto. Then, an organic layer 144c is disposed to fill the plurality of second grooves. Finally, similar to FIG. 4D, a second inorganic layer (not shown) is disposed to cover the first inorganic layer 142 and the organic layer 144c.

It is worth mentioning that, in the present disclosure, disposing the plurality of grooves in the stress concentration area of the first inorganic layer 142 (for example, both sides of the second retaining wall 134 or the crack suppression structure 136), and filling the plurality of grooves with the organic materials may disperse the stress of the inorganic layer during the process of bending or testing the surface roughness of the panel. Therefore, the higher density of the plurality of grooves may provide more benefits in dispersing the stress of the inorganic layer during the process of bending or testing the surface roughness of the panel. In addition, the depth of each of the plurality of grooves is less than or equal to half thickness of the first inorganic layer 142, which is favorable for dispersing the stress of the inorganic layer during the process of bending or testing the surface roughness of the panel.

In some embodiments, the plurality of grooves may be disposed only in the first inorganic layer 142 close to at least one side of the second retaining wall 134. In other embodiments, the plurality of grooves may be disposed only in the first inorganic layer 142 close to at least one side of the crack suppression structure 136. In other embodiments, the plurality of grooves may be disposed in the first inorganic layer 142 close to at least one side of the second retaining wall 134 and in the first inorganic layer 142 close to at least one side of the crack suppression structure 136. It is worth mentioning that when the plurality of grooves are disposed in the first inorganic layer 142 close to both sides of the second retaining wall 134 and in the first inorganic layer 142 close to both sides of the crack suppression structure 136, the effect of dispersing the stress of the inorganic layer during the process of bending or testing the surface roughness of the panel is the best.

Figure 7:
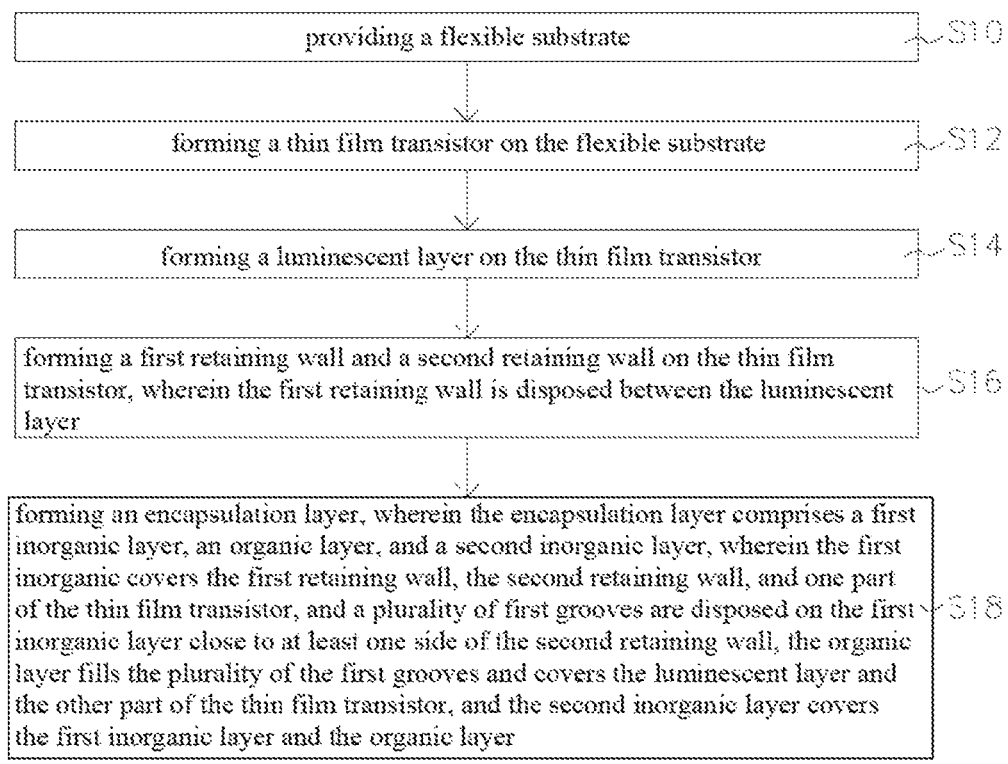
FIG. 7 is a flow chart of the method of manufacturing the flexible display device according to another embodiment of the present disclosure.

FIG. 7 is a flow chart of the method of manufacturing the flexible display device according to another embodiment of the present disclosure.

Referring to FIG. 7, the present disclosure provides a method of manufacturing a flexible display device, comprising the following steps.

A step of S10: providing a flexible substrate 100.

A step of S12: disposing a thin film transistor 110 on the flexible substrate 100.

A step of S14: disposing the luminescent layer 120 on the thin film transistor 110.

A step of S16: disposing a first retaining wall 132 and a second retaining wall 134 on the thin film transistor 110, and the first retaining wall 132 is located between the luminescent layer 120 and the second retaining wall 134.

A step of S18: disposing an encapsulation layer 140. The encapsulation layer 140 comprises a first inorganic layer 142, an organic layer 144, and a second inorganic layer 146. The first inorganic layer 142 covers the first retaining wall 132, the second retaining wall 134. A plurality of first grooves 150 are disposed in the first inorganic layer 142 close to at least one side of the second retaining wall 134, and the organic layer 144 fills the plurality of first grooves 150 and covers the luminescent layer 120 and the other part of the thin film transistor 110. The second inorganic layer 146 covers the first inorganic layer 142 and the organic layer 144.

In addition, in some embodiments, the method of manufacturing the flexible display device further comprises the following steps. A crack suppression structure 136 is disposed on the flexible substrate 100, and the first inorganic layer 142 covers the crack suppression structure 136. A plurality of second grooves (not shown) are disposed in the first inorganic layer 142 close to at least one side of the crack suppression structure 136, and the organic layer 144c fills the plurality of second grooves.

Based on the above, the flexible display device of the present disclosure may disperse the stress of the inorganic layer during the process of bending or testing the surface roughness of the panel by filling the stress concentration area of the first inorganic layer with the organic materials, thereby reducing the risk of cracking or peeling of the encapsulation layer and ensuring the surface roughness performance of the panel, which may facilitate the development of narrow bezel flexible displays.

In summary, although the present disclosure has been disclosed as the above with preferred embodiments, the above preferred embodiments are not intended to limit the present disclosure. A person ordinarily skilled in the art can make various changes and modifications without departing from the concept and scope of the present disclosure. Therefore, the claimed scope of the present disclosure is based on the scope defined by the claims.

What is claimed is:

1. A flexible display device comprising:
   a flexible substrate;
   a thin film transistor disposed on the flexible substrate;
   a luminescent layer disposed on the thin film transistor;
   a first retaining wall and a second retaining wall disposed on the thin film transistor, wherein the first retaining wall is located between the luminescent layer and the second retaining wall; and
   an encapsulation layer, comprising a first inorganic layer, an organic layer, and a second inorganic layer, wherein the first inorganic layer covers the first retaining wall, the second retaining wall, and one part of the thin film transistor, and a plurality of first grooves are disposed in the first inorganic layer close to at least one side of the second retaining wall, the organic layer fills the plurality of first grooves and covers the luminescent layer and the other part of the thin film transistor, and the second inorganic layer covers the first inorganic layer and the organic layer,
   wherein the plurality of first grooves are disposed in the first inorganic layer close to both sides of the second retaining wall, and the plurality of first grooves are a plurality of discontinuous grooves.

2. The flexible display device according to claim 1, wherein the flexible display further comprises a crack suppression structure disposed on the flexible substrate, wherein the first inorganic layer covers the crack suppression structure, and a plurality of second grooves are disposed in the first inorganic layer close to at least one side of the crack suppression structure, and the organic layer fills the plurality of second grooves.

3. The flexible display device according to claim 2, wherein the plurality of second grooves are disposed in the first inorganic layer close to both sides of the crack suppression structure.

4. The flexible display device according to claim 2, wherein a first depth of each of the plurality of first grooves is less than or equal to a half thickness of the first inorganic layer, and a second depth of each of the plurality of second grooves is less than or equal to a half thickness of the first inorganic layer.

5. The flexible display device according to claim 1, wherein a material of the organic layer comprises acrylate, polyacrylate, polycarbonate or polystyrene.

6. The flexible display device according to claim 1, wherein a pattern shape of each of the plurality of first grooves comprises a circle, a quadrangle, or a trapezoid.

7. A flexible display device, comprising:
   a flexible substrate;
   a thin film transistor disposed on the flexible substrate;
   a luminescent layer disposed on the thin film transistor;
   a first retaining wall and a second retaining wall disposed on the thin film transistor, wherein the first retaining wall is located between the luminescent layer and the second retaining wall; and
   an encapsulation layer, comprising a first inorganic layer, an organic layer, and a second inorganic layer, wherein the first inorganic layer covers the first retaining wall, the second retaining wall, and one part of the thin film transistor, and a plurality of first grooves are disposed in the first inorganic layer close to at least one side of the second retaining wall, the organic layer fills the plurality of first grooves and covers the luminescent layer and the other part of the thin film transistor, and the second inorganic layer covers the first inorganic layer and the organic layer.

8. The flexible display device according to claim 7, wherein the plurality of first grooves are disposed in the first inorganic layer close to both sides of the second retaining wall.

9. The flexible display device according to claim 7, wherein the flexible display device further comprises a crack suppression structure disposed on the flexible substrate, wherein the first inorganic layer covers the crack suppression structure, and a plurality of second grooves are disposed in the first inorganic layer close to at least one side of the crack suppression structure, and the organic layer fills the plurality of second grooves.

10. The flexible display device according to claim 9, wherein the plurality of second grooves are disposed in the first inorganic layer close to both sides of the crack suppression structure.

11. The flexible display device according to claim 9, wherein a first depth of each of the plurality of first grooves is less than or equal to a half thickness of the first inorganic layer, and a second depth of each of the plurality of second grooves is less than or equal to a half thickness of the first inorganic layer.

12. The flexible display device according to claim 7, wherein a material of the organic layer comprises acrylate, polyacrylate, polycarbonate or polystyrene.

13. The flexible display device according to claim 7, wherein a pattern shape of each of the plurality of first grooves comprises a circle, a quadrangle, or a trapezoid.

14. A method of manufacturing a flexible display device, comprising steps of:
   providing a flexible substrate;
   disposing a thin film transistor on the flexible substrate;
   disposing a luminescent layer on the thin film transistor;
   disposing a first retaining wall and a second retaining wall on the thin film transistor, wherein the first retaining wall is located between the luminescent layer and the second retaining wall; and
   disposing an encapsulation layer, wherein the encapsulation comprises a first inorganic layer, an organic layer, and a second inorganic layer, the first inorganic layer covers the first retaining wall, the second retaining wall, and one part of the thin film transistor, and a plurality of first grooves are disposed in the first inorganic layer close to at least one side of the second retaining wall, the organic layer fills the plurality of first grooves and covers the luminescent layer and the other part of the thin film transistor, and the second inorganic layer covers the first inorganic layer and the organic layer.

15. The method of manufacturing the flexible display device according to claim 14, further comprising:

disposing a crack suppression structure on the flexible substrate, wherein the first inorganic layer covers the crack suppression structure, and a plurality of second grooves are disposed in the first inorganic layer close to at least one side of the crack suppression structure, and the organic layer fills the plurality of second grooves.

16. The method of manufacturing the flexible display device according to claim 15, wherein a method of disposing the plurality of first grooves and the plurality of second grooves comprises photolithography or dry etching.

17. The method of manufacturing the flexible display device according to claim 15, wherein a method of filling the plurality of first grooves and the plurality of second grooves with the organic layer comprises an inkjet printing method.

18. The method of manufacturing the flexible display device according to claim 15, wherein a first depth of each of the plurality of first grooves is less than or equal to a half thickness of the first inorganic layer, and a second depth of each of the plurality of second grooves is less than or equal to a half thickness of the first inorganic layer.

19. The method of manufacturing the flexible display device according to claim 14, wherein a material of the organic layer comprises acrylate, polyacrylate, polycarbonate or polystyrene.

20. The method of manufacturing the flexible display device according to claim 14, wherein a pattern shape of each of the plurality of first grooves comprises a circle, a quadrangle, or a trapezoid.

* * * * *